(12) United States Patent
Bang et al.

(10) Patent No.: US 7,492,032 B2
(45) Date of Patent: Feb. 17, 2009

(54) FUSE REGIONS OF A SEMICONDUCTOR MEMORY DEVICE AND METHODS OF FABRICATING THE SAME

(75) Inventors: Kwang-Kyu Bang, Hwaseong-si (KR); Kun-Gu Lee, Seoul (KR); Kyoung-Suk Lyu, Yongin-si (KR); Jeong-Ho Bang, Yongin-si (KR); Kyeong-Seon Shin, Yongin-si (KR); Ho-Jeong Choi, Yongin-si (KR); Seung-Gyoo Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 362 days.

(21) Appl. No.: 11/108,636

(22) Filed: Apr. 19, 2005

(65) Prior Publication Data
US 2005/0236688 A1 Oct. 27, 2005

(30) Foreign Application Priority Data
Apr. 21, 2004 (KR) .................... 10-2004-0027486

(51) Int. Cl.
*H01L 21/44* (2006.01)
(52) U.S. Cl. .................. 257/529; 257/528; 257/E23.15; 438/132; 438/333; 438/601; 438/600
(58) Field of Classification Search ................ 257/209, 257/528, 529, 665, E21.579, E21.147, E23.15, 257/530, E21.592, E23.002, E23.149, 538; 438/132, 215, 281, 333, 467, 131, 600, 601
See application file for complete search history.

(56) References Cited

U.S. PATENT DOCUMENTS 6,300,232 B1   10/2001  Satoh
6,306,746 B1 * 10/2001  Haley et al. .................. 438/601
6,479,407 B2 * 11/2002  Yokoyama et al. .......... 438/788
6,489,227 B1 * 12/2002  Hsieh et al. .................. 438/601
6,617,664 B2 *  9/2003  Hayashi et al. .............. 257/529
6,638,845 B2 * 10/2003  Kagiwata ..................... 438/601
2002/0155672 A1 * 10/2002  Wang et al. .................. 438/333

(Continued)

FOREIGN PATENT DOCUMENTS

JP       2003-037166 A     2/2003

(Continued)

OTHER PUBLICATIONS

German Office Action (dated Dec. 14, 2007) for counterpart German Patent Application 10 2005 019 702.7-33 is provided for the purposes of certification under 37 C.F.R. §§ 1.97(e).

*Primary Examiner*—Zandra V. Smith
*Assistant Examiner*—Latanya Crawford
(74) *Attorney, Agent, or Firm*—Harness, Dickey & Pierce, P.L.C.

(57) ABSTRACT

A device and method of manufacturing a fuse region are disclosed. The fuse region may include an interlayer insulating layer formed on a substrate, a plurality of fuses disposed on the interlayer insulating layer, and fuse isolation walls located between the fuses, wherein each of the fuse isolation walls may include lower and upper fuse isolation patterns.

17 Claims, 9 Drawing Sheets

U.S. PATENT DOCUMENTS

| | | | |
|---|---|---|---|
| 2003/0052385 A1* | 3/2003 | Mori | 257/529 |
| 2003/0132526 A1* | 7/2003 | Jeon et al. | 257/774 |
| 2003/0141568 A1* | 7/2003 | Sato et al. | 257/529 |
| 2004/0016990 A1* | 1/2004 | Yang | 257/529 |
| 2004/0229168 A1* | 11/2004 | Lee et al. | 430/311 |
| 2005/0101114 A1* | 5/2005 | Daubenspeck et al. | 438/601 |
| 2005/0212081 A1* | 9/2005 | Kang et al. | 257/529 |
| 2005/0236688 A1* | 10/2005 | Bang et al. | 257/529 |

FOREIGN PATENT DOCUMENTS

| | | |
|---|---|---|
| JP | 2003-142582 A | 5/2003 |
| KR | 1020000061306 A | 10/2000 |

* cited by examiner

FUSE REGIONS OF A SEMICONDUCTOR MEMORY DEVICE AND METHODS OF FABRICATING THE SAME

PRIORITY STATEMENT

This U.S. non-provisional application claims benefit to Korean Patent Application No. 2004-0027486, filed Apr. 21, 2004, in the Korean Patent Intellectual Property Office, the contents of which are incorporated by reference herein in their entirety.

BACKGROUND OF THE INVENTION

1. Field of the Invention

Example embodiments of the present invention relate generally to semiconductor devices and methods of fabricating the same, and more particularly, to fuse regions of a semiconductor memory device and methods of fabricating the same.

2. Description of the Related Art

Memory devices (i.e., semiconductor memory chips) formed at a semiconductor substrate may be electrically tested prior to an assembly process to determine whether the semiconductor memory chips are damaged or not. When the test determines a damaged chip(s), the damaged chip may operate abnormally due to at least one failed cell. The failed cells may be replaced with redundant cells using a repair process. The repair process may include an irradiating procedure with an irradiating device, such as a laser beam, by blowing predetermined fuses so that some of the redundant cells may include addresses of the failed cells in a write mode and/or a read mode. The fuses may be formed of conductive material layers comprising, for example, a doped poly silicon layer, an aluminum layer, a tungsten silicide layer and/or a tungsten layer.

As semiconductor devices become more highly integrated, distances between the fuses may be gradually reduced. However, the reduced distance between the fuses may cause damage during the repair process. In other words, in the event that one of the selected fuses is blown using a laser beam, the non-selected fuses adjacent to the selected fuse may be damaged due to the laser beam.

Figure 1:
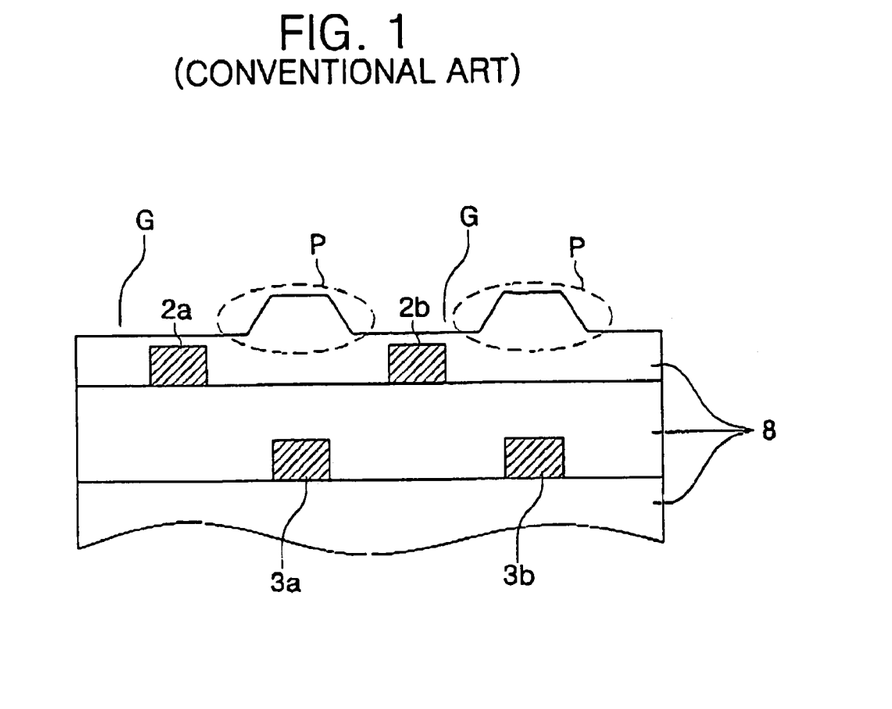
FIGS. 1 and 2 are cross-sectional views illustrating conventional fuse regions.

FIG. 1 is a cross-sectional view illustrating a fuse region in a conventional art.

Referring to FIG. 1, a pair of first fuse wires 2a and 2b and a pair of second fuse wires 3a and 3b may be provided in a tetra-ethyl-ortho-silicate (TEOS) oxide layer 8. The second fuse wires 3a and 3b may be located at a lower level than the first fuse wires 2a and 2b. Also, the second fuse wires 3a and 3b may be located below regions between the first fuse wires 2a and 2b. In addition, the TEOS oxide layer 8 may have protrusions P located over the second fuse wires 3a and 3b. As a result, recessed grooves G may be provided between the protrusions P.

In order to selectively blow one of the first fuse wires 2a and 2b, a laser beam should be irradiated onto selected fuse wire 2a, for example. However, if the laser beam is misaligned with the selected first fuse wire 2a, the laser beam may be irradiated elsewhere including the protrusion P adjacent to the selected first fuse wire 2a. In this case, when energy of the laser beam is not precisely controlled, the second fuse wire 3a adjacent to the selected first fuse wire 2a may be damaged due to the laser beam.

Figure 2:
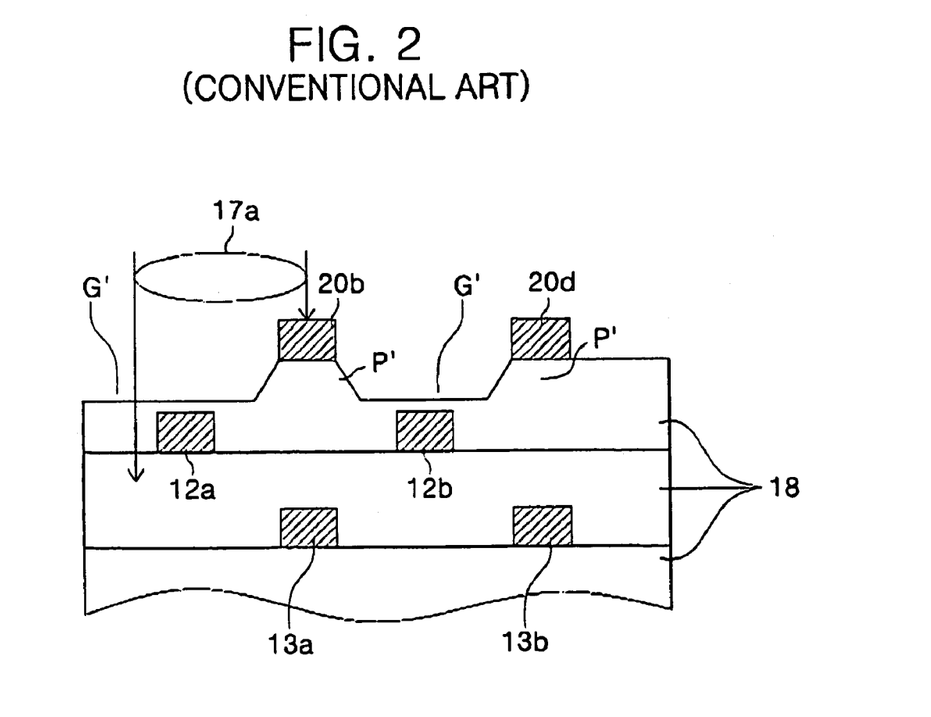

FIG. 2 is a cross-sectional view illustrating a fuse region disclosed in the conventional art.

Referring to FIG. 2, a pair of first fuse wires 12a and 12b and a pair of second fuse wires 13a and 13b may be provided in a TEOS oxide layer 18 which may have the same structure as shown in FIG. 1. The TEOS oxide layer 18 also may have protrusions P' located over the second fuse wires 13a and 13b. Thus, recessed grooves G' may be provided between the protrusions P'. In addition, cover patterns 20b and 20d may be disposed on the protrusions P'. The cover patterns 20b and 20d may be composed of, for example, a metal layer to increase a blocking effect of a laser beam.

In order to selectively blow one of the first fuse wires 12a and 12b, a laser beam 17a should be irradiated onto selected fuse wire 12a, for example. If the laser beam 17a is misaligned with the selected first fuse wire 12a, as shown in FIG. 2, an edge of the cover pattern 20b adjacent to the selected fuse wire 12a may be exposed to the laser beam 17a. However, in this case, even though the laser beam 17a may be irradiated onto the edge of the cover pattern 20b due to a misalignment of the laser beam 17a, the cover pattern 20b may reduce and/or prevent the second fuse wire 13a adjacent to the selected first fuse wire 12a from being damaged by the laser beam 17a.

As described above, the cover patterns 20b and 20d may prevent the second fuse wires 13a and 13b from being damaged by the misaligned laser beam. However, when the protrusions (P in FIG. 1 and P' in FIG. 2) and the cover patterns 20b and 20d are misaligned with the second fuse wires 13a and 13b, the second fuse wires 13a and 13b may still be damaged by the misaligned laser beam.

Figure 3:
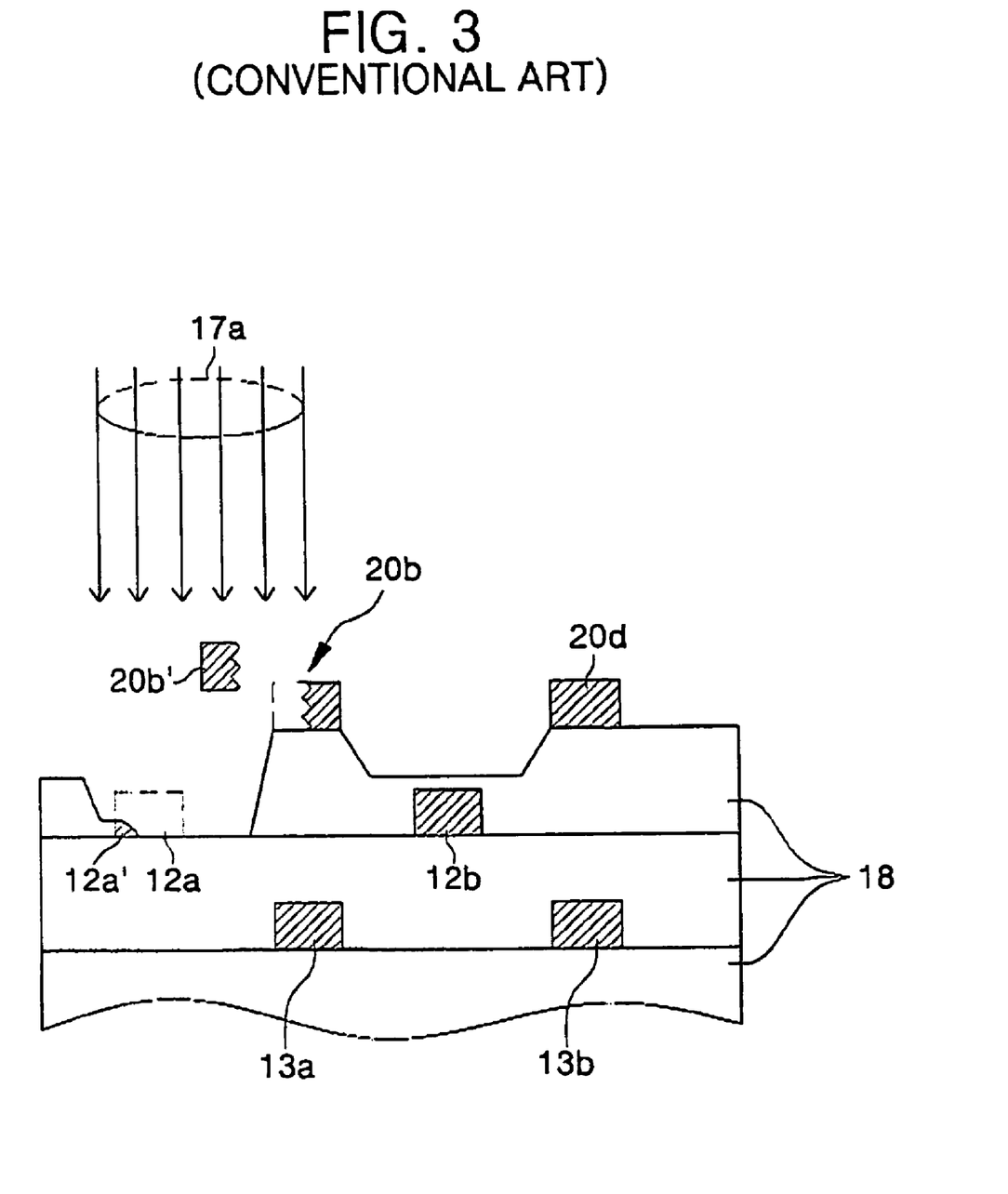
FIG. 3 is a cross-sectional view illustrating drawbacks of the conventional fuse region shown in FIG. 2.

FIG. 3 is a cross-sectional view illustrating a fuse region disclosed in the conventional art, in which several drawbacks will be discussed.

Referring to FIG. 3, the laser beam 17a may be irradiated onto the first fuse wire 12a to selectively blow the first fuse wire 12a as described with reference to FIG. 2. When the laser beam 17a is irradiated onto the edge of the cover pattern 20b due to the misalignment of the laser beam 17a, a portion 20b' of the cover pattern 20b may be detached away from a surface of the TEOS oxide layer 18 as shown in FIG. 3. The detached cover pattern 20b' may then be re-adsorbed to a surface of the semiconductor substrate having the fuse region to act as a contaminant. In other words, when the detached cover pattern 20b' is re-adsorbed to a region between the adjacent interconnection lines, the detached cover pattern 20b' may electrically connect the adjacent interconnection lines to each other, thereby causing an abnormal operation of the semiconductor device.

In addition, when the laser beam 17a is misaligned with the selected first fuse wire 12a, for example, the selected first fuse wire 12a in a region onto which the laser beam 17a is irradiated may not be completely blown. As a result, as shown in FIG. 3, a fuse residue 12a' may remain in the irradiation region of the laser beam 17a. This event may be due to an adhesion between the selected first fuse wire 12a and the TEOS oxide layer 18 as well as a weak irradiation energy at the edge of the laser beam 17a.

SUMMARY OF THE INVENTION

An example embodiment of the present invention discloses a fuse region. The fuse region may include an interlayer insulating layer formed on a substrate, a plurality of fuses disposed on the interlayer insulating layer, and fuse isolation walls located between the fuses, wherein each of the fuse isolation walls may include lower and upper fuse isolation patterns.

In another example embodiment, the lower and upper fuse isolation patterns may be sequentially stacked.

In another example embodiment, the upper fuse isolation pattern may have a different etch selectivity with respect to the lower fuse isolation pattern.

In yet another example embodiment, the lower fuse isolation pattern may be a material layer which may have a faster etch rate than the upper fuse isolation pattern.

In yet another example embodiment, the lower fuse isolation pattern may be a plasma TEOS oxide layer, and the upper fuse isolation pattern may be at least one of a densified flowable oxide (FOX) layer and an undoped silicate glass (USG) layer.

In yet another example embodiment, the densified FOX layer may be a baked hydrogen silsesquioxane (HSQ) layer.

In another example embodiment, the fuse isolation walls may be spaced apart from the fuses to provide recessed gap regions between the fuse isolation walls and the fuses, and the fuse isolation walls may be self-aligned with the fuses.

In yet another example embodiment, the fuse isolation walls may have upwardly sloped sidewalls so that upper widths of the fuse isolation walls are approximately smaller than lower widths thereof.

In yet another example embodiment, the recessed gap regions may extend into the interlayer insulating layer to isolate the fuses from the fuse isolation walls.

In another example embodiment, the interlayer insulating layer may be the same material layer as the lower fuse isolation pattern.

In another example embodiment, the interlayer insulating layer may be a material layer having a faster etch rate than the lower fuse isolation pattern.

Another example embodiment of the present invention discloses a method of fabricating a fuse region. The method may include forming an interlayer insulating layer on a substrate, forming a plurality of fuses on the interlayer insulating layer, and forming fuse isolation walls located between the plurality of fuses, wherein each of the fuse isolation walls may include lower and upper fuse isolation patterns.

Another example embodiment of the present invention discloses a method of fabricating a fuse region. The method may include forming an interlayer insulating layer on a substrate, forming a plurality of fuses on the interlayer insulating layer, forming a lower fuse isolation layer on the substrate having the plurality of fuses, forming upper fuse isolation patterns to fill grooves that may be surrounded by the lower fuse isolation layer between the fuses, forming an inter-metal insulating layer on the upper fuse isolation patterns, forming a passivation layer on the inter-metal insulating layer, forming a photoresist pattern on the passivation layer, the photoresist pattern being formed to have an opening which may cross over the plurality of fuses, and successively etching the passivation layer, the inter-metal insulating layer and the lower fuse isolation layer using the photoresist pattern as an etch mask to form a fuse window that may expose top surfaces and sidewalls of the fuses and to simultaneously form lower fuse isolation patterns that may exist below the upper fuse isolation patterns, the upper fuse isolation patterns serving as etch stoppers during formation of the fuse window.

In another example embodiment, forming the upper fuse isolation patterns may include forming an upper fuse isolation layer that may fill grooves between the plurality of fuses, the upper fuse isolation layer being formed of a material layer having a slower etch rate than the lower fuse isolation layer, and removing the upper fuse isolation layer until a top surface of the lower fuse isolation layer on the fuses is exposed.

In another example embodiment, the upper fuse isolation layer may be formed of at least one of a densified flowable oxide (FOX) layer and an undoped silicate glass (USG) layer, and the lower fuse isolation layer is formed of a plasma TEOS oxide layer.

In another example embodiment, forming the densified FOX layer may include coating a hydrogen silsesquioxane (HSQ) layer on the lower fuse isolation layer using a spin on glass (SOG) technique, and baking the HSQ layer at a temperature which may be equal to or lower than approximately 500° C.

In another example embodiment, the upper fuse isolation layer may be removed using at least one of an etch-back technique and a chemical mechanical polishing technique.

In another example embodiment, the inter-metal insulating layer may be formed of the same material as the lower fuse isolation layer.

In another example embodiment, the plasma TEOS oxide layer may be selectively etched using a $CF_4$ gas, a $CH_3$ gas and an oxygen gas as process gases during formation of the fuse window.

In another example embodiment, the method may include etching the interlayer insulating layer after formation of the lower fuse isolation patterns.

In another example embodiment, the interlayer insulating layer may be formed of the same material layer as the lower fuse isolation layer.

Another example embodiment discloses a semiconductor device including a fuse region and a pad region on a substrate, an interlayer insulating layer formed on the substrate, a plurality of fuses disposed on the interlayer insulating layer, and fuse isolation walls located between the plurality of fuses, each of the fuse isolation walls including lower and upper fuse isolation patterns.

Another example embodiment discloses a method of fabricating a semiconductor device including preparing a substrate having a fuse region and a pad region, forming an interlayer insulating layer on the substrate, forming a plurality of fuses on the interlayer insulating layer, and forming fuse isolation walls located between the plurality of fuses, wherein each of the fuse isolation walls includes lower and upper fuse isolation patterns.

Another example embodiment discloses a method of fabricating a semiconductor device including preparing a substrate having a fuse region and a pad region, forming an interlayer insulating layer on the substrate, forming a plurality of fuses on the interlayer insulating layer in the fuse region, forming a lower fuse isolation layer on the substrate having the plurality of fuses, forming upper fuse isolation patterns that fill grooves that may be surrounded by the lower fuse isolation layer between the fuses, forming an inter-metal insulating layer on the substrate having the upper fuse isolation patterns, forming metal pads on the inter-metal insulating layer in the pad region, forming a passivation layer on the metal pads and the inter-metal insulating layer, forming a photoresist pattern on the passivation layer, the photoresist pattern being formed to have a fuse opening which may cross over the fuse and pad openings which may be located above the metal pads, and successively etching the passivation layer, the inter-metal insulating layer and the lower fuse isolation layer using the photoresist pattern as an etch mask to form a fuse window that may expose top surfaces and sidewalls of the plurality of fuses, pad windows that may expose the metal pads, and lower fuse isolation layer patterns that remain under the upper fuse isolation layer patterns, the upper fuse isolation layer patterns acting as etch stoppers during formation of the fuse window.

BRIEF DESCRIPTION OF THE DRAWINGS

The invention will be apparent from the more particular description of example embodiments of the invention, as illustrated in the accompanying drawings. The drawings are not necessarily to scale, emphasis instead being placed upon illustrating the general principles of example embodiments of the invention.

DETAILED DESCRIPTION OF EXAMPLE EMBODIMENTS

Example embodiments of the present invention will now be described more fully hereinafter with reference to the accompanying drawings. Example embodiments of the present invention may, however, be embodied in different forms and should not be construed as limited to the example embodiments set forth herein. Rather, these example embodiments are provided so that this disclosure will be thorough and complete, and will fully convey the scope of the invention to those skilled in the art. Like numbers refer to like elements throughout the specification.

It should further be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements may be exaggerated relative to other elements.

For example, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer. Further, it will be understood that when a layer is referred to as being "on" or "formed over" another layer or substrate, the layer may be directly on the other layer or substrate, or intervening layer(s) may also be present.

Figure 4:
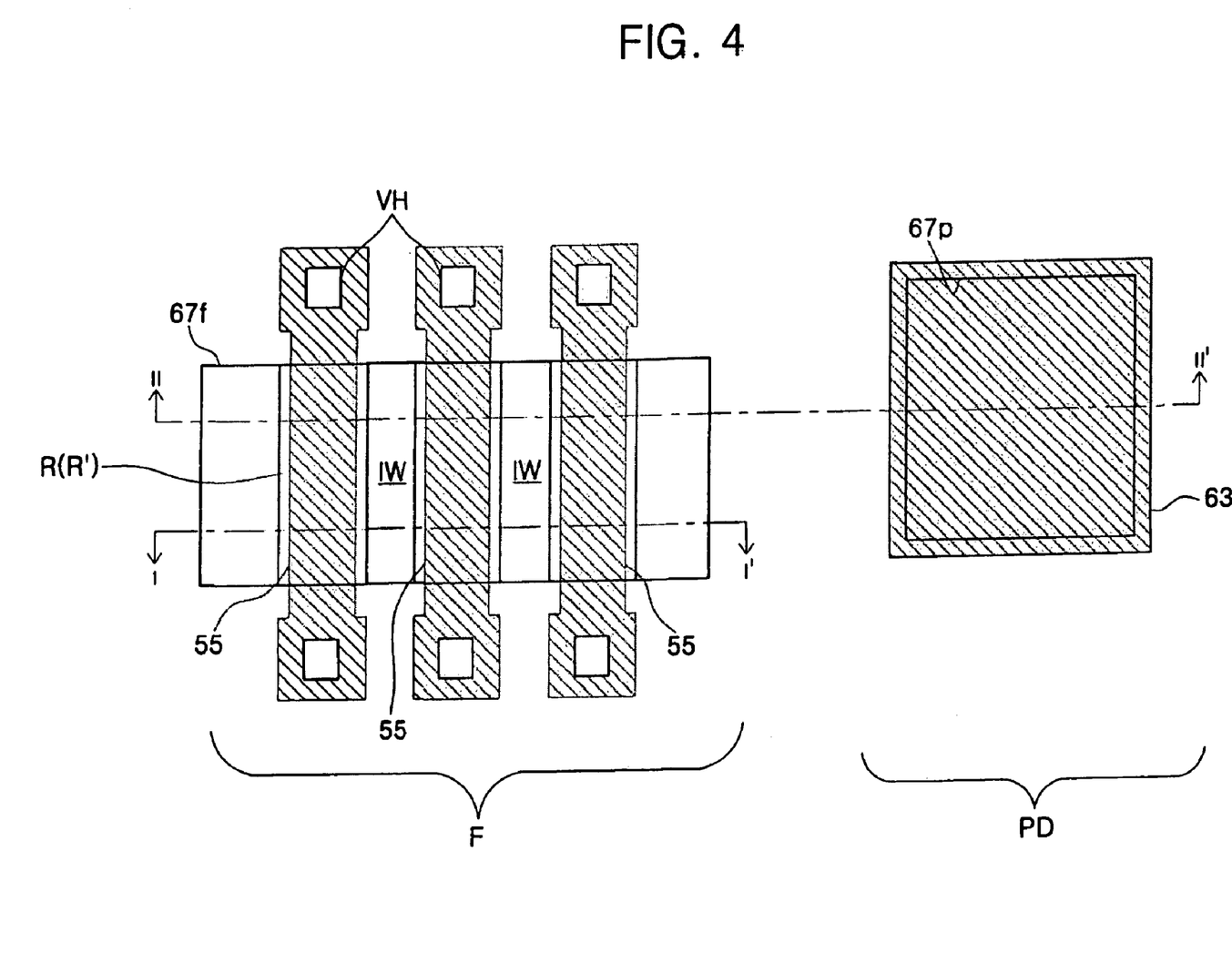
FIG. 4 is a plan view illustrating a semiconductor memory device having a fuse region according to an example embodiment of the present invention.
Figure 5:
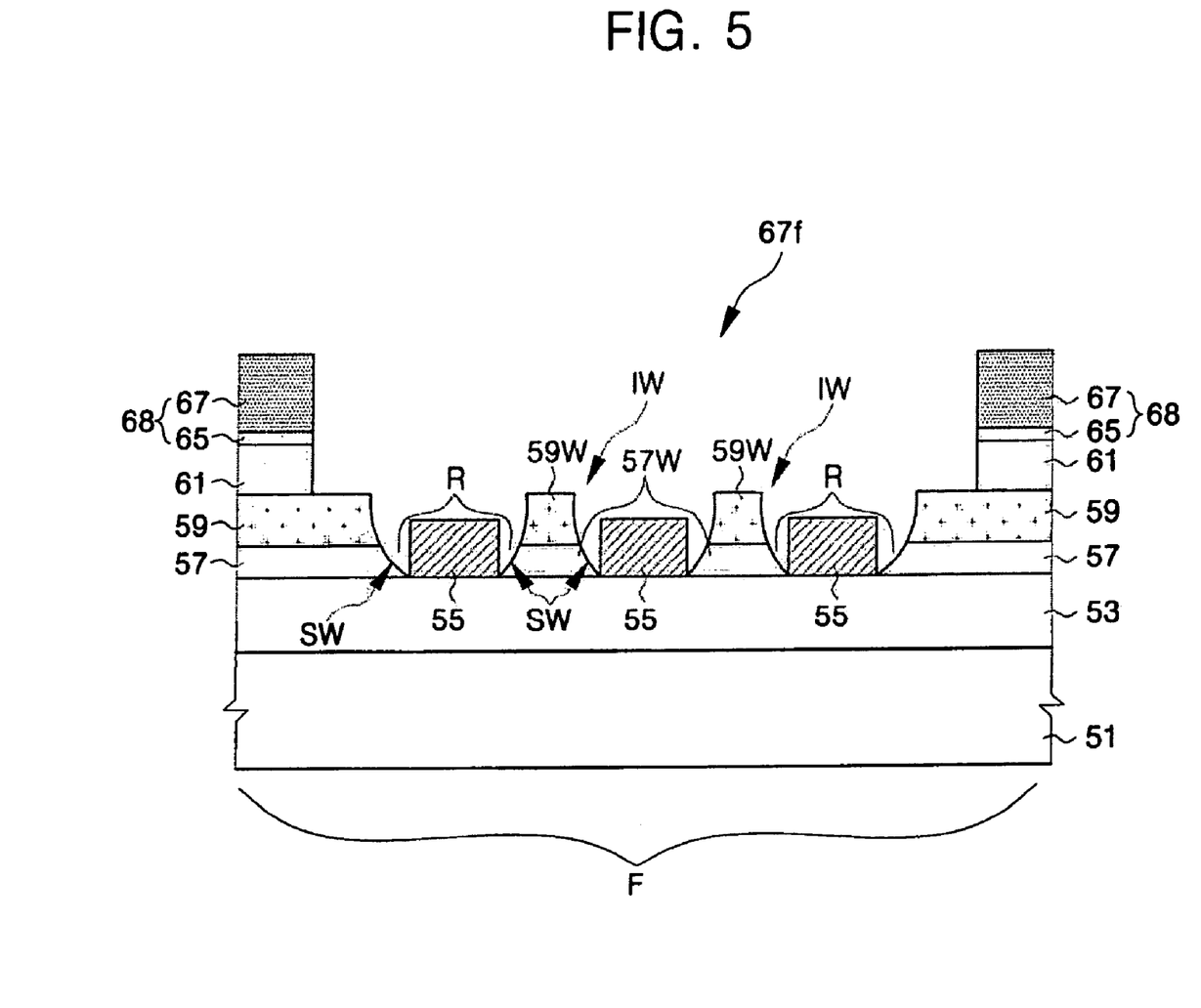
FIG. 5 is a cross-sectional view taken along the line I-I' of FIG. 4, according to an example embodiment of the present invention.
Figure 6:
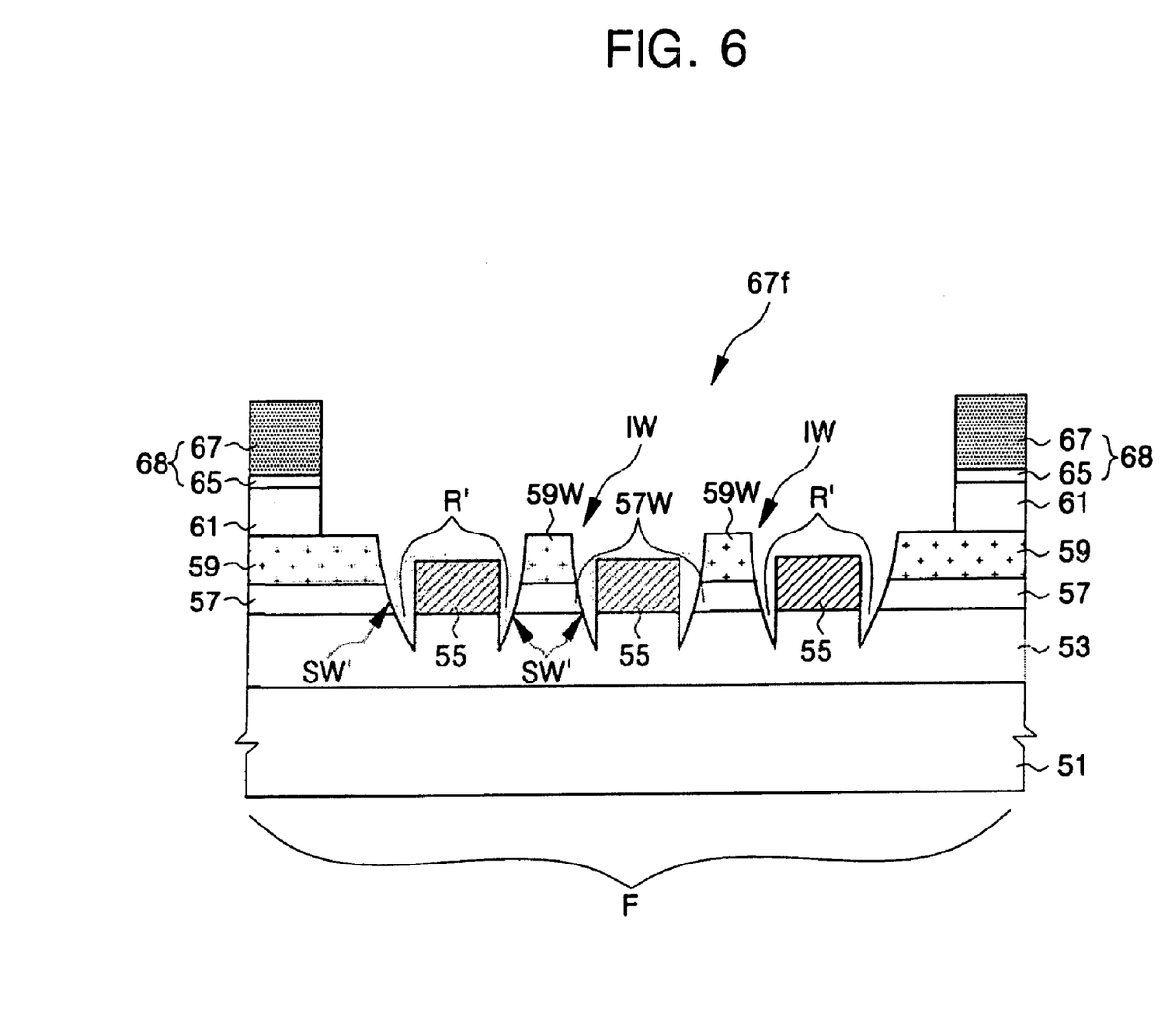
FIG. 6 is a cross-sectional view taken along the line I-I' of FIG. 4, according to an example embodiment of the present invention.

FIG. 4 is a plan view illustrating a fuse region F and a pad region PD according to example embodiments of the present invention, and FIGS. 5 and 6 are cross-sectional views taken along the line I-I' of FIG. 4, illustrating fuse regions according to example embodiments of the present invention.

Referring to FIGS. 4, 5 and 6, an interlayer insulating layer 53 may be provided on an integrated circuit substrate 51, such as, for example, a silicon substrate. A plurality of fuses 55 may be disposed on the interlayer insulating layer 53. The plurality of fuses 55 may be disposed to be parallel with each other as shown in FIG. 4. The fuses 55 may be composed of a conductive material layer, for example, but not limited to, a doped poly silicon layer, a metal silicide layer, a metal layer, a metal nitride layer, and/or a combination layer thereof.

Lower and upper fuse isolation layers 57 and 59 may be sequentially stacked on the interlayer insulating layer 53 of the substrate 51 having the fuses 55. As an example embodiment, fuse isolation walls IW may be disposed between the fuses 55. Each of the fuse isolation walls IW may include a lower fuse isolation pattern 57W and an upper fuse isolation pattern 59W, which may be sequentially stacked. The lower fuse isolation pattern 57W may be the same material layer as the lower fuse isolation layer 57, and the upper fuse isolation pattern 59W may be the same material layer as the upper fuse isolation layer 59. However, it should be appreciated that fuse isolation patterns 57W and 59W may have different material layer than the fuse isolation layers 57 and 59.

The fuses 55 which may cross over in a fuse window 67f may be separated by fuse isolation walls IW. The fuse isolation walls IW may be self-aligned with the fuses 55 which may be located at approximately middle portions between the fuses 55. As a result, recessed gap regions (R in FIG. 5) may be provided between the fuses 55 and the fuse isolation walls IW in the fuse window 67f. Sidewalls of the fuse isolation walls IW may have a sloped sidewall profile as shown in FIG. 5. That is, the fuse isolation walls IW may have upwardly sloped sidewalls SW so that upper widths of the fuse isolation walls IW may be smaller than lower widths thereof. However, it should be appreciated that the sidewall profile may have other profiles besides the upwardly sloped profile as depicted in FIG. 5.

As shown in FIG. 6, according to another example embodiment of the present invention, recessed gap regions R' provided between the fuses 55 and the fuse isolation walls IW in the fuse window 67f may be deeper than the gap regions R shown in FIG. 5. That is, the recessed gap regions R' may extend into the interlayer insulating layer 53, thereby completely isolating the fuses 55 from the fuse isolation walls IW. As a result, sidewalls SW' of the fuse isolation walls IW may also have an upwardly sloped profile as shown in FIG. 6.

The upper fuse isolation patterns 59W (or the upper fuse isolation layer 59) may be a material layer having a different etch selectivity with respect to the lower fuse isolation patterns 57W (or the lower fuse isolation layer 57). In other words, the upper fuse isolation layer 59 may be a material layer that may have a slower etch rate than the lower fuse isolation layer 57. As an example embodiment, when the lower fuse isolation layer 57 is a plasma TEOS oxide layer, the upper fuse isolation layer 59 may be a densified flowable oxide (FOX) layer and/or an undoped silicate glass (USG) layer. It should be appreciated that other layers may make up the lower and upper fuse isolation layers. The densified FOX layer may be a material layer baking a liquid material coated using, for example, but not limited to, a spin on glass (SOG) technique. The densified FOX layer may also be a baked hydrogen silsesquioxane (HSQ) layer.

The interlayer insulating layer 53 may be the same material layer as the lower fuse isolation layer 57. It should also be appreciated by one skilled in the art that the interlayer insulating layer 53 and the lower fuse isolation layer 57 may be different material layers. Further, the interlayer insulating layer 53 may be a material layer that may have a faster etch rate than the lower fuse isolation layer 57.

The fuse window 67f may be defined by an inter-metal insulating layer 61 and a passivation layer 68 which may be sequentially stacked on an outside region of the fuse region F. The inter-metal insulating layer 61 may be the same material layer as the lower fuse isolation layer 57. However, it should be appreciated that the inter-metal insulating layer 61 may be different material layer as the lower fuse isolation layer 57. The passivation layer 68 may include a plasma oxide layer 65 and a plasma nitride layer 67 which may be sequentially stacked. It should be appreciated that the passivation layer 68 may include other layers besides the one mentioned above.

FIGS. 7 to 10 are cross-sectional views taken along the line II-II' of FIG. 4, to describe methods of fabricating a fuse region and pad regions adjacent to the fuse region according to example embodiments of the present invention. In the drawings, reference characters "F" and "PD" denote the fuse region and the pad region, respectively.

Figure 7:
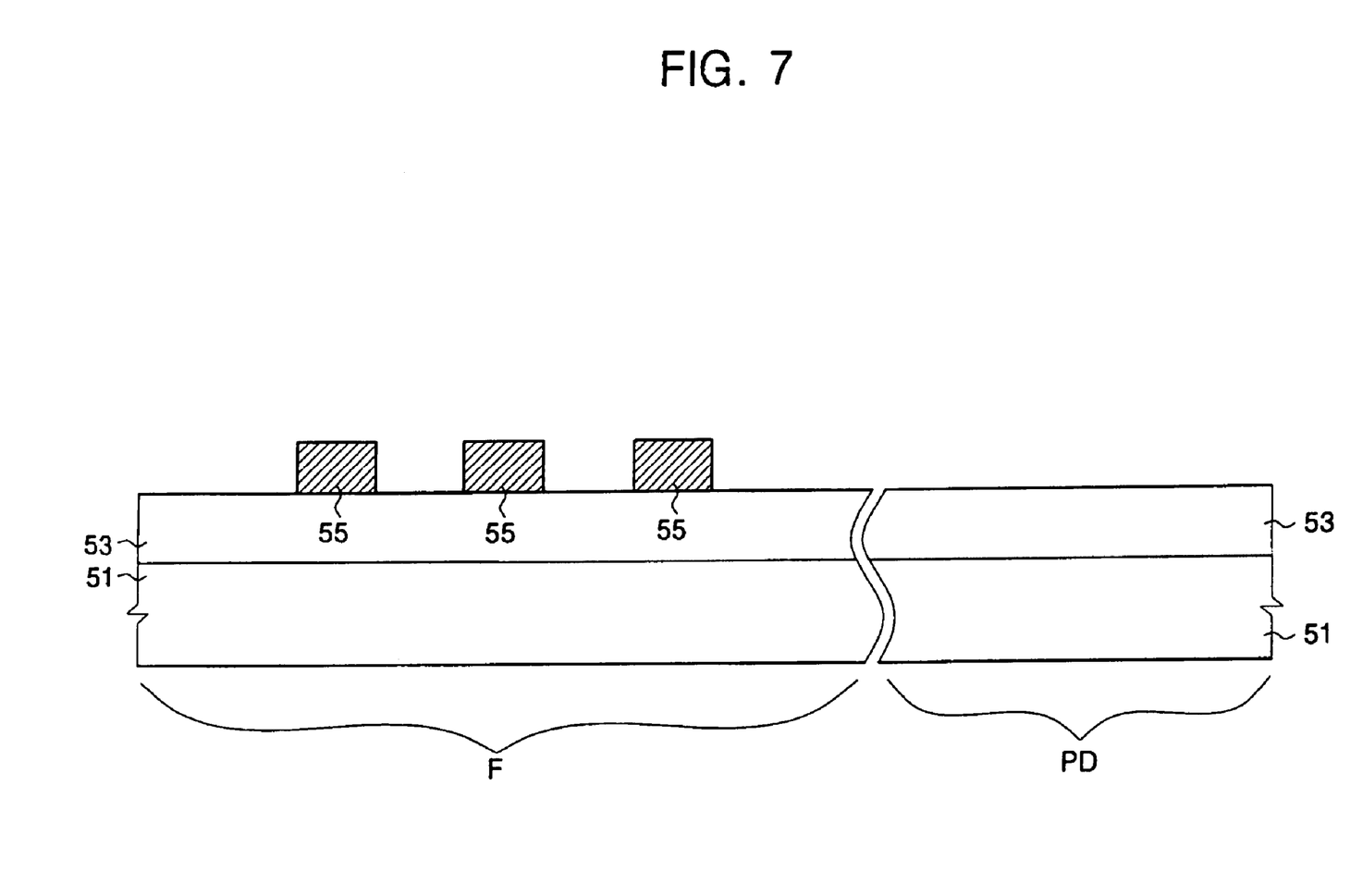
FIGS. 7 to 10 are cross-sectional views taken along the line II-II' of FIG. 4, for explaining methods of fabricating a semiconductor memory device having a fuse region according to another example embodiment of the present invention.

Referring to FIGS. 4 and 7, an interlayer insulating layer 53 may be formed on a semiconductor substrate 51. Prior to formation of the interlayer insulating layer 53, discrete devices such as, but not limited to, transistors, capacitors and/or resistors may be formed at the semiconductor substrate 51. A conductive layer (not shown), for example, but not limited to, a doped poly silicon layer, a metal silicide layer, a metal layer, a metal nitride layer and/or a combination layer thereof may be formed on the insulating layer 53. The conductive layer may then be patterned to form a plurality of fuses 55 on the interlayer insulating layer 53 in the fuse region F.

Figure 8:
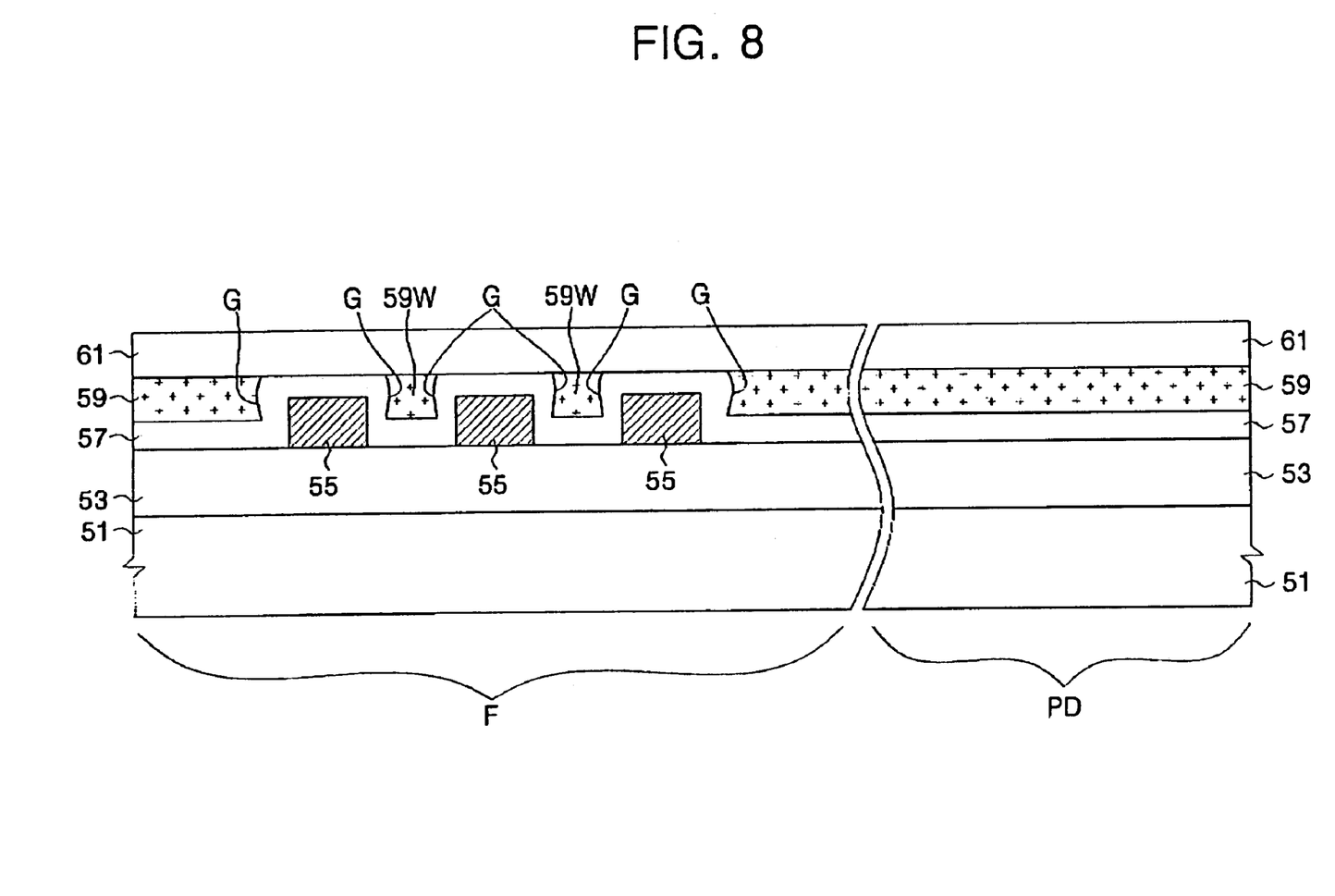

Referring to FIGS. 4 and 8, a lower fuse isolation layer 57 may be formed on the substrate 51 having the fuses 55. As shown in FIG. 8, the lower fuse isolation layer 57 may be conformably formed to have a surface profile, which may be similar as the semiconductor substrate 51 having the fuses 55. That is, the lower fuse isolation layer 57 may be formed of a plasma TEOS oxide layer having a reduced thickness than the fuses 55. In this case, grooves G surrounded by the lower fuse isolation layer 57 may be provided between the fuses 55. The interlayer insulating layer 53 may be formed of the same material layer as the lower fuse isolation layer 57. It should also be appreciated by one skilled in the art that the interlayer insulating layer 53 and the lower fuse isolation layer 57 may be different material layers. Further, the interlayer insulating layer 53 may be formed of a material layer which may have a faster etch rate than the lower fuse isolation layer 57.

An upper fuse isolation layer 59 may be formed on the lower fuse isolation layer 57 to fill the grooves G. The upper fuse isolation layer 59 may be formed of a material layer that can completely fill the grooves G without any voids. The upper fuse isolation layer 59 may be formed of a material layer having a different etch selectivity with respect to the lower fuse isolation layer 57. As an example embodiment, the upper fuse isolation layer 59 may be formed of a material layer, which may have a slower etch rate than the lower fuse isolation layer 57.

In an example embodiment, the upper fuse isolation layer 59 may be formed of a densified FOX layer and/or an undoped silicate glass (USG) oxide layer. The densified FOX layer may be formed by coating an HSQ layer on the lower fuse isolation layer 57 using, for example, but not limited to, a SOG technique and baking the HSQ layer at a temperature which may be approximately equal to or lower than about 500° C.

Subsequently, the upper fuse isolation layer 59 may be planarized and/or removed until a top surface of the lower fuse isolation layer 57 above the fuses 55 is exposed, thereby forming upper fuse isolation patterns 59W in the grooves G between the fuses 55. The upper fuse isolation patterns 59W maybe spaced apart from the fuses 55 to provide first gap regions between the fuse isolation walls IW and the fuses 55. The spaces of the fuses 55 of the first gap regions being smaller than the horizontal widths of the fuses 55. The removal of the upper fuse isolation layer 59 may be performed using, for example, but not limited to, an etch-back technique and/or a chemical mechanical polishing (CMP) technique. An inter-metal insulating layer 61 may then be formed on the semiconductor substrate having the upper fuse isolation patterns 59W. The inter-metal insulating layer 61 may be formed of the same material layer as the lower fuse isolation layer 57. It should also be appreciated that the inter-metal insulating layer 61 and the lower fuse isolation layer 57 may be different material layers.

Figure 9:
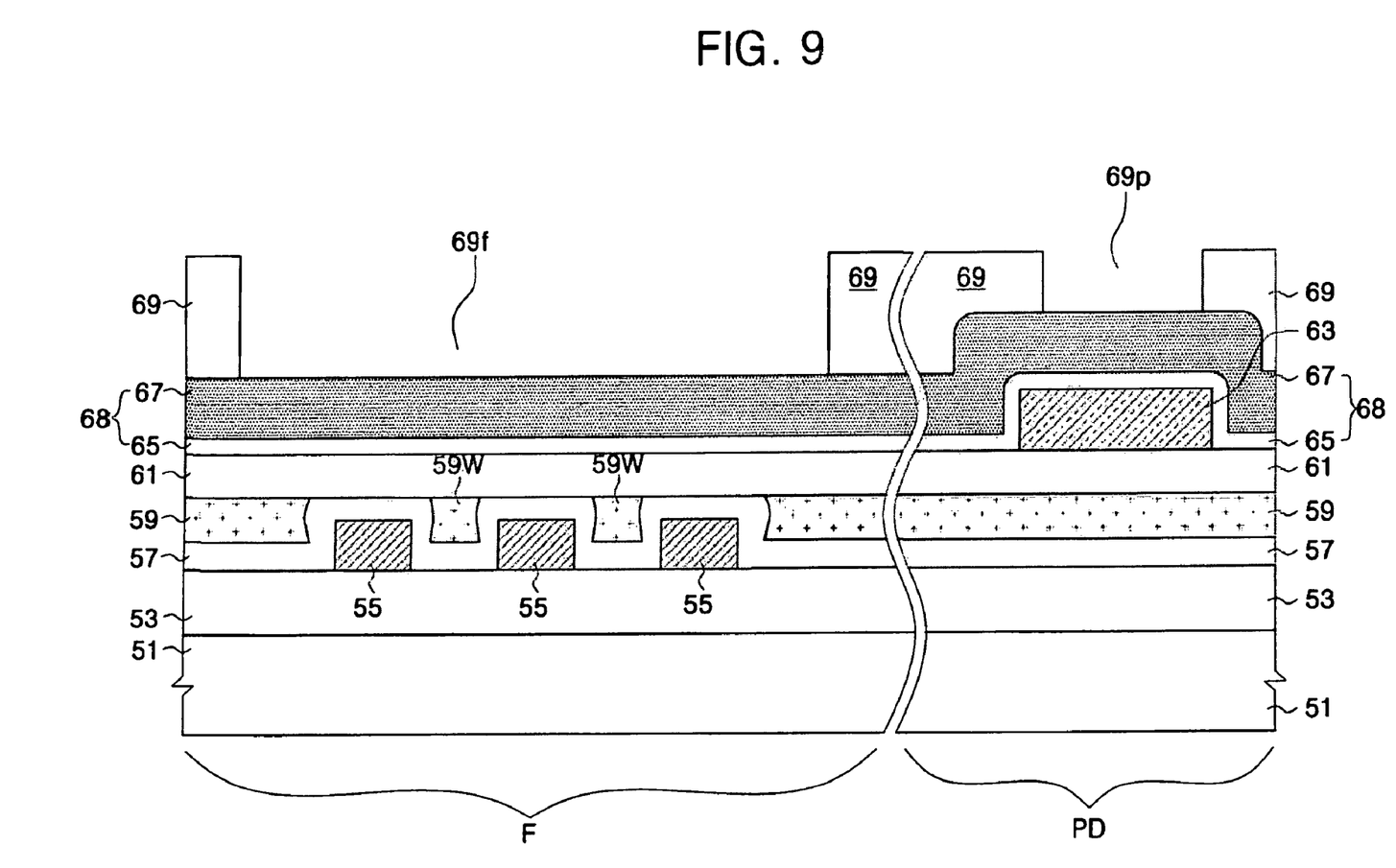

Referring to FIGS. 4 and 9, the inter-metal insulating layer 61 may be patterned to form via holes (VH of FIG. 4) that expose both ends of the fuses 55. Then, an upper metal layer (not shown) may be formed on the substrate having the via holes VH. The upper metal layer may be patterned to form upper metal interconnection lines electrically connected to the fuses 55 through the via holes VH. The upper metal layer may also be patterned to simultaneously form at least one metal pad 63 on the inter-metal insulating layer 61 in the pad region PD. The upper metal layer may be formed of, for example, but not limited to, an aluminum layer and/or an aluminum alloy layer. A passivation layer 68 may be formed on the semiconductor substrate having the metal pad 63. The passivation layer 68 may be formed by sequentially stacking, for example, but not limited to, a plasma oxide layer 65 and a plasma nitride layer 67. It should be appreciated that the passivation layer 68 may be formed with other layer materials besides the ones mentioned above. A photoresist pattern 69 may be formed on the passivation layer 68. The photoresist pattern 69 may be formed to have a fuse opening 69f and a pad opening 69p. As an example embodiment of the present invention, the fuse opening 69f may be located over the fuses 55, and the pad opening 69p may be located above the metal pad 63.

Figure 10:
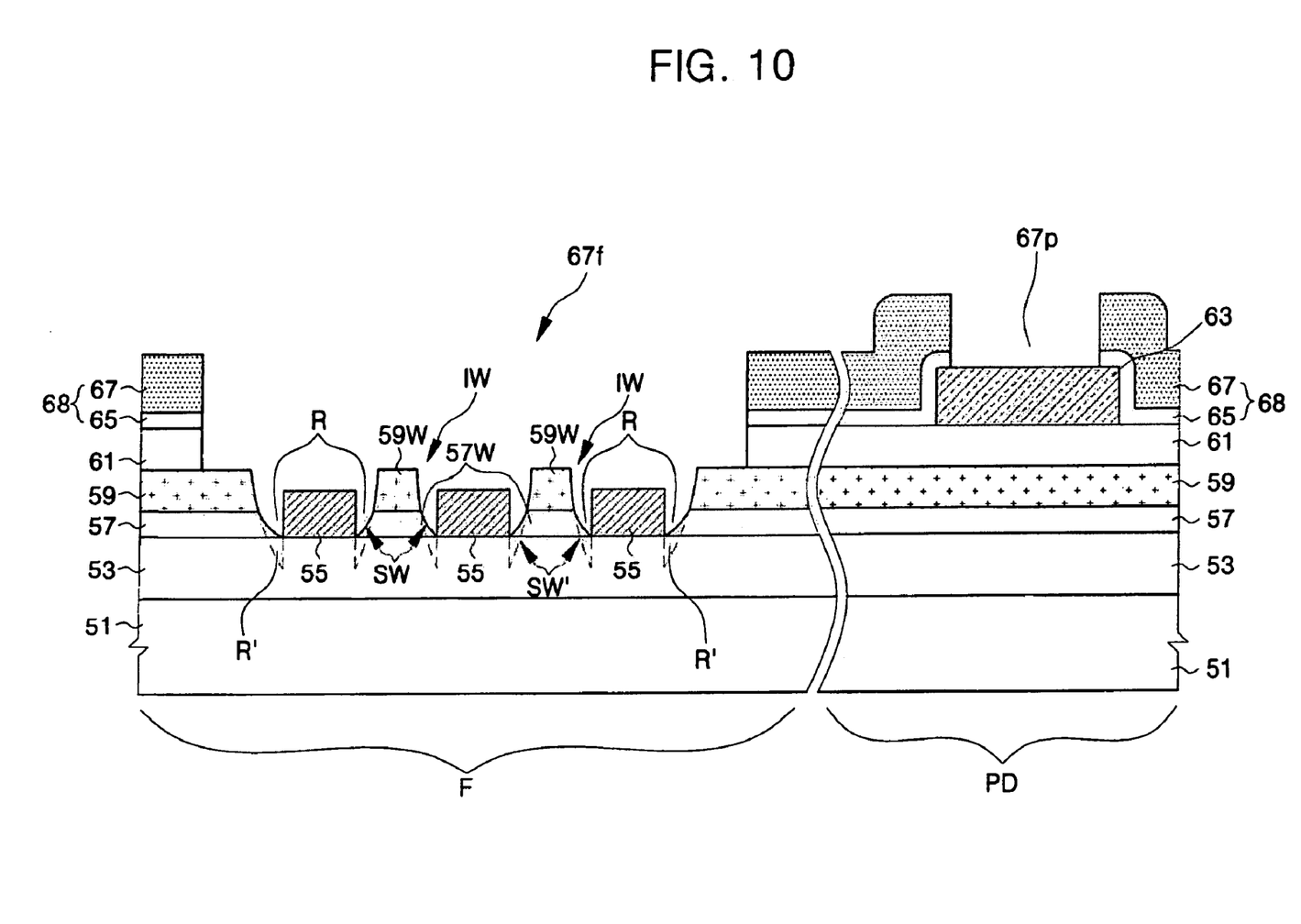

Referring to FIGS. 4 and 10, the passivation layer 68, the inter-metal insulating layer 61 and the lower fuse isolation layer 57 may be etched using the photoresist pattern 69 as an etch mask to thereby form the fuse window 67f that exposes the fuses 55 and the pad window 67p that exposes the metal pad 63. The inter-metal insulating layer 61 and the lower fuse isolation layer 57 may be etched using, for example, but not limited to, a CF4 gas, a CHF3 gas and/or an oxygen gas.

As an example embodiment of the present invention, the upper fuse isolation patterns 59W may have a different etch selectivity with respect to the inter-metal insulating layer 61 and the lower fuse isolation layer 57. That is, the upper fuse isolation patterns 59W may exhibit a slower etch rate than the inter-metal insulating layer 61 and the lower fuse isolation layer 57. As a result, self-aligned fuse isolation walls IW may be formed between the fuses 55 as shown in FIG. 10, and each of the fuse isolation walls IW may include the upper fuse isolation pattern 59W and the lower fuse isolation pattern 57W which may be under the upper fuse isolation pattern 59W.

During formation of the fuse window 67f, sidewalls of the fuses 55 in the fuse window 67f may also be exposed. As a result, recessed gap regions R may be formed between the fuses 55 and the fuse isolation walls IW. The fuse isolation walls IW may be formed to have sidewalls SW with an upwardly sloped profile as shown in FIG. 10. That is, the fuse isolation walls IW may be formed so that upper widths of the fuse isolation walls IW may be smaller than lower widths thereof. However, it should be appreciated that the sidewall profile may have other profiles besides the upwardly sloped sidewalls.

Furthermore, after formation of the lower fuse isolation patterns 57W, the interlayer insulating layer 53 may be additionally etched. In this case, gap regions R' which may be deeper than the gap regions R may be formed between the fuses 55 and the fuse isolation walls IW. As a result, the gap regions R' completely separate the fuses 55 from the fuse isolation walls IW. Even when the gap regions R' are formed, sidewalls SW' of the fuse isolation walls IW may also heave a upwardly sloped profile.

As described above, according to example embodiments of the present invention, the sidewalls of fuses 55 in the fuse window region 67f may be completely exposed, and the self-aligned fuse isolation walls IW may be formed between the fuses 55. Thus, when a laser beam is irradiated to selectively blow one of the fuses 55, it may be easier to completely cut and/or remove the selected fuse without any damage to the adjacent non-selected fuses even if the laser beam is misaligned.

Although example embodiments of the present invention describe the fuse region of a semiconductor memory device, it should be appreciated that the fuse region may be provided in other areas of the semiconductor device.

Example embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of example embodiments of the present invention as set forth in the following claims.

What is claimed is:

1. A fuse region, comprising:
an interlayer insulating layer formed on a substrate;
a fuse window defined by an inter-metal insulating layer and a passivation layer, wherein the fuse window, the inter-metal insulating layer and the passivation layer are formed on the interlayer insulating layer;
a plurality of fuses in the fuse window; and
a plurality of inter-fuse isolation walls located between each of the plurality of fuses, each of the inter-fuse isolation walls including lower and upper inter-fuse isolation patterns,
wherein the upper inter-fuse isolation patterns are spaced apart from the fuses to provide first gap regions between the inter-fuse isolation walls and the fuses, and the lower inter-fuse isolation patterns are spaced apart from the fuses to provide second gap regions between the inter-fuse isolation walls and the fuses, the space of the second gap regions being smaller than the space of the first gap regions.

2. The fuse region of claim 1, wherein the lower and upper inter-fuse isolation patterns are sequentially stacked.

3. The fuse region of claim 1, wherein the upper inter-fuse isolation patterns have a different etch selectivity with respect to the lower inter-fuse isolation patterns.

4. The fuse region of claim 3, wherein the lower inter-fuse isolation patterns are material layers which have a faster etch rate than the upper inter-fuse isolation patterns.

5. The fuse region of claim 4, wherein the lower inter-fuse isolation pattern layers are plasma TEOS oxide layers, and the upper inter-fuse isolation patterns are at least one of a densified flowable oxide (FOX) layers and an undoped silicate glass (USG) layers.

6. The fuse region of claim 5, wherein the densified FOX layers are baked hydrogen silsesquioxane (HSQ) layers.

7. The fuse region of claim 1, wherein the inter-fuse isolation walls are self-aligned with the fuses.

8. The fuse region of claim 7, wherein the inter-fuse isolation walls have upwardly sloped sidewalls so that upper widths of the inter-fuse isolation walls are smaller than lower widths thereof.

9. The fuse region of claim 7, wherein the second gap regions extend into the interlayer insulating layer to isolate the fuses from the inter-fuse isolation walls.

10. The fuse region of claim 9, wherein the inter-fuse isolation walls have upwardly sloped sidewalls so that upper widths of the inter-fuse isolation walls are smaller than lower widths thereof.

11. The fuse region of claim 1, wherein the interlayer insulating layer is the same material layer as the lower inter-fuse isolation pattern.

12. The fuse region of claim 3, wherein the interlayer insulating layer is a material layer having a faster etch rate than the lower inter-fuse isolation pattern.

13. A fuse region, comprising:
an interlayer insulating layer formed on a substrate;
a fuse window defined by an inter-metal insulating layer and a passivation layer,
wherein the fuse window, the inter-metal insulting layer and the passivation layer are formed on the interlayer insulating layer,
a plurality of fuses in the fuse window; and
a plurality of inter-fuse isolation walls located between each of the plurality of fuses, each of the inter-fuse isolation walls including lower and upper inter-fuse isolation patterns,
wherein the upper inter-fuse isolation patterns are spaced apart from the fuses to provide first gap regions between the inter-fuse isolation walls and the fuses,
a the spaces of the first gap regions being smaller than horizontal widths of the fuses.

14. The fuse region of claim 13, wherein the lower inter-fuse isolation patterns are spaced apart from the fuses to provide second gap regions between the inter-fuse isolation walls and the fuses.

15. The fuse region of claim 14, wherein the spaces of the second gap regions are smaller than the spaces of the first gap regions.

16. The fuse region of claim 13, wherein the interlayer dielectric layer has recessed gap regions provided between the inter-fuse isolation walls and the fuses.

17. The fuse region of claim 16, wherein the recessed gap regions downwardly extend into the interlayer insulating layer.

* * * * *